United States Patent
Kawamura et al.

(10) Patent No.: US 6,607,866 B1
(45) Date of Patent: Aug. 19, 2003

(54) LITHOGRAPHIC PRINTING PLATE SUPPORT AND LITHOGRAPHIC PRINTING PLATE PRECURSOR USING THE SAME

(75) Inventors: Koichi Kawamura, Shizuoka (JP); Akio Oda, Shizuoka (JP); Norio Aoshima, Shizuoka (JP); Sumiaki Yamasaki, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 233 days.

(21) Appl. No.: 09/671,628

(22) Filed: Sep. 28, 2000

(30) Foreign Application Priority Data

| Sep. 29, 1999 | (JP) | ............................................. 11-277010 |
| Apr. 20, 2000 | (JP) | ........................................ 2000-119557 |
| Apr. 20, 2000 | (JP) | ........................................ 2000-119587 |
| Apr. 21, 2000 | (JP) | ........................................ 2000-121177 |

(51) Int. Cl.$^7$ ..................... G03C 1/492; G03C 1/494; G03C 1/76
(52) U.S. Cl. .................. 430/270.1; 430/271.1; 430/302; 101/453; 101/457; 101/463.1
(58) Field of Search .................. 430/270.1, 271.1, 430/275.1, 276.1, 302, 303, 348, 944, 945, 964; 101/453, 457, 463.1

(56) References Cited

U.S. PATENT DOCUMENTS

| 4,275,092 A | | 6/1981 | Nakayama et al. ......... 427/54.1 |
| 5,370,906 A | * | 12/1994 | Dankert .................... 427/261 |
| 5,455,134 A | * | 10/1995 | Dankert ....................... 430/49 |
| 5,633,118 A | | 5/1997 | Burberry et al. ............. 430/292 |
| 5,807,659 A | * | 9/1998 | Nishimiya et al. ........... 430/302 |
| 5,914,211 A | * | 6/1999 | Hashino et al. .............. 430/166 |
| 6,114,089 A | * | 9/2000 | Takita et al. ............... 430/278.1 |
| 6,190,832 B1 | * | 2/2001 | Goffing et al. ............. 430/273.1 |
| 6,306,492 B1 | * | 10/2001 | Yamada et al. ........... 428/317.7 |
| 2001/0009129 A1 | * | 7/2001 | Kunita et al. ................ 101/453 |
| 2001/0019760 A1 | * | 9/2001 | Kawamura ................... 428/195 |
| 2002/0023565 A1 | * | 2/2002 | Kawamura et al. ........... 101/453 |
| 2002/0106583 A1 | * | 8/2002 | Kawamura et al. ....... 430/271.1 |

FOREIGN PATENT DOCUMENTS

| EP | 0871070 | | 10/1998 | | |
| EP | 0938972 | | 9/1999 | | |
| EP | 1 088 679 A2 | * | 4/2001 | ............ | B41N/3/03 |
| EP | 1 134 076 A2 | * | 9/2001 | ............ | B41C/1/10 |
| EP | 1 211 096 A1 | * | 6/2002 | ............ | B41N/3/03 |
| JP | 54074102 | | 6/1979 | | |
| JP | 01238935 | | 9/1989 | | |
| JP | 01279257 | | 11/1989 | | |
| JP | 2001/113846 A | * | 4/2001 | ............ | B41N/1/14 |
| JP | 2002-221785 A | * | 8/2002 | ............ | G03F/7/00 |
| RU | 425536 | | 5/1975 | | |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A lithographic printing plate support includes a support and a hydrophilic layer on the support, wherein the hydrophilic layer includes a polymer compound that is chemically bonded directly to the support surface and has a hydrophilic functional group.

6 Claims, No Drawings

LITHOGRAPHIC PRINTING PLATE SUPPORT AND LITHOGRAPHIC PRINTING PLATE PRECURSOR USING THE SAME

FIELD OF THE INVENTION

The present invention relates to a lithographic printing plate support provided with a novel hydrophilic layer, and to a lithographic printing plate precursor using such a support. In particular, the invention is concerned with a lithographic printing plate support which enables the adoption of both positive-working and negative-working modes and ensures excellent sensitivity and scum resistance, and to a lithographic printing plate precursor using such a support.

BACKGROUND OF THE INVENTION

Hitherto employed hydrophilic substrates or hydrophilic layers for lithographic printing plates are anodically oxidized aluminum substrates, or substrates or hydrophilic layers prepared by treating anodized aluminum substrates with subbing agents, such as silicate, polyvinyl phosphonic acid (JP-A-7-1853, wherein the term "JP-A" means an "unexamined published Japanese patent application") and polyvinyl benzoic acid, for the purpose of further enhancing their hydrophilicity. There are a growing number of researches on hydrophilicity-imparted substrates or supports and hydrophilic layers in the case of using an aluminum support. In addition, the art of using a sulfonic acid group-containing polymer for the subbing layer of a photosensitive layer is disclosed in JP-A-59-101651.

As to the hydrophilic layer provided in the case of using a flexible support, such as a PET (polyethylene terephthalate) or cellulose acetate film, in place of a metal support such as an aluminum sheet, the art of forming a hydrophilic layer from a hydrophilic polymer and a hydrophobic polymer to impart swelling properties to the layer is known by the description in JP-A-8-292558, the art of covering the surface of a PET support with micro-porous hydrophilic cross-linked silicate is known by the description in European Patent 0 709 228, and the art of curing a hydrophilic polymer-containing hydrophilic layer with a hydrolyzed tetraalkyl orthosilicate is known by the descriptions in JP-A-8-272087 and JP-A-8-507727.

While those hydrophilic layers provide lithographic printing plates by the use of which scum-free prints can be obtained at the beginning of printing, it has been expected from the practical point of view to further heighten the hydrophilicity of a hydrophilic layer and to develop lithographic printing plate precursors capable of providing scum-free prints under severer printing conditions also.

SUMMARY OF THE INVENTION

Therefore, an object of the invention is to solve the aforementioned current problems and, more specifically, to provide a support for a positive-working or negative-working lithographic printing plate, which has a hydrophilic layer having high hydrophilicity and high bonding power to a support to enable particular improvement in printing scum resistance, thereby ensuring scum-free prints even under severe printing conditions, and further to provide a lithographic printing plate precursor using such a support.

In order to attain the aforementioned objects, we have made intensive studies on hydrophilic layers that have high hydrophilicity and don't peel off the substrate thereof. As a result, it has been found that scum-free prints can be obtained even under severe printing conditions by the use of a polymer compound layer prepared by subjecting, for example, a PET film surface to glow treatment (irradiation with oxygen plasma in vacuo), thereby inducing active species such as radicals on the PET film surface, and then adding a hydrophilic group-containing monomer capable of initiating the reaction with the active species to cause graft polymerization on the film surface, namely a hydrophilic layer chemically bonded to the film substrate at the polymer chain end.

In other words, the invention comprises the following embodiments (1) to (8):

(1) A lithographic printing plate support, comprising a support and a hydrophilic layer on the support, wherein the hydrophilic layer comprises a polymer compound that is chemically bonded directly to the support surface and has a hydrophilic functional group.

(2) The lithographic printing plate support as described in (1) above, wherein said polymer compound is a hydrophilic functional group-containing straight-chain polymer compound that is chemically bonded directly to the support surface at an end of the polymer chain.

(3) The lithographic printing plate support as described in (1) above, wherein said polymer compound is a polymer compound comprising (a) a polymer backbone chemically bonded to the support surface and (b) a hydrophilic functional group-containing straight-chain polymer compound combined at an end of a polymer chain thereof with the polymer backbone.

(4) A lithographic printing plate precursor comprising a support, a hydrophilic layer and an image-forming layer in this order, wherein the hydrophilic layer comprises a polymer compound that is chemically bonded directly to the support surface and has a hydrophilic functional groups.

(5) The lithographic printing plate precursor as described in (4) above, wherein said polymer compound is a hydrophilic functional group-containing straight-chain polymer compound that is chemically bonded directly to the support surface at an end of the polymer chain.

(6) The lithographic printing plate precursor as described in (4) above, wherein said polymer compound is a polymer compound comprising (a) a polymer backbone chemically bonded to the support surface and (b) a hydrophilic functional group-containing straight-chain polymer compound combined at an end of a polymer chain thereof with the polymer backbone.

(7) A lithographic printing plate precursor comprising a support, a hydrophilic layer and a sensitive layer in this order, wherein the hydrophilic layer comprises a polymer compound that is chemically bonded directly to the support surface and has a hydrophilic functional group and the sensitive layer comprises a polymer compound containing a functional group capable of changing the hydrophobic or hydrophilic property upon exposure to heat, acid or radiation.

(8) A lithographic printing plate precursor comprising a support, a hydrophilic layer comprising a polymer compound that is chemically bonded directly to the support surface and has a hydrophilic functional group and on the hydrophilic layer an ablative ink-receiving layer.

The problems have been solved, as described above, by adopting as the art of making use of very high hydrophilicity the hydrophilic layer formed of a hydrophilic polymer grafted on the support surface. More specifically, the resolution of problems becomes feasible by preparing a lithographic printing plate support provided with a hydrophilic layer that is formed of a polymer compound containing hydrophilic functional groups and chemically bonded to the support surface, wherein the polymer compound is chemically bonded to the support surface directly at its polymer chain end or via a polymer backbone chemically bonded to the support surface, and further preparing a lithographic printing plate precursor using the aforesaid support.

Further, it is already known that the hydrophilicity of a hydrophilic layer can be enhanced by increasing the water-receptivity in the hydrophilic layer. However, conventional hydrophilic layers have a problem that, when it is tried to increase the water-holding capacity therein, they always come to have an increased degree of swelling and become weak in structure to result in the lowering of their film strength or the deterioration of adhesiveness to supports.

When the hydrophilic layer characteristic of the invention, which is formed of the hydrophilic functional group-containing polymer compound chemically bonded directly to a support surface, takes the form of surface hydrophilic graft polymer, the polymer chain has a restraint-free structure, except that it is bound to the support surface, so that water is easy to get into the hydrophilic layer. Therefore, the present hydrophilic layer is characterized by its great water-holding capacity. Indeed, it is reported in literature that the surface hydrophilic graft polymers absorb much water and swell to a great extent. On the other hand, as the surface hydrophilic graft polymer is chemically bonded to the support surface directly at the polymer chain end, no deterioration of the adhesiveness to the support surface is caused even when the swelling occurs. Thus, although the relation between the water-holding capacity and the adhesiveness was a tradeoff to conventional arts, the resolution of this tradeoff by the invention is thought to bring about the effects of the invention.

Further, to the present lithographic printing plate support as well as the lithographic printing plate precursor using such a support, it is advantageous for the support surface (solid surface), directly to which a polymer compound is chemically bonded, to be roughened. Roughening the solid surface, as described hereinafter, can bring benefits such that the hydrophilicity in the non- image area becomes high, and thereby the degree of discrimination between hydrophobic areas and hydrophilic areas is heightened and the scumming is prevented from developing during printing.

DETAILED DESCRIPTION OF THE INVENTION

The present lithographic printing plate support and lithographic printing plate precursors using the present support are illustrated below in detail.

The hydrophilic layer chemically bonded directly to a support surface and having hydrophilic functional groups, which is characteristic of the present lithographic printing plate support and lithographic printing plate precursors using the present support, has no particular restrictions as to the structure. However, the following two structures can be instanced: One structure is built up of hydrophilic functional group-containing polymer chains which are chemically bonded directly to a support surface at their respective ends, and the other structure is made up of a polymer backbone chemically bonded to a support surface and straight-chain polymer compounds attached to the polymer backbone at their respective chain ends.

The specific hydrophilic layers as mentioned above can be formed using various means. As an example, the means referred to as surface graft polymerization can be employed.

Description of Surface Graft Polymerization

Graft polymerization is a method of synthesizing a graft polymer by providing active species on the chain of a polymer compound and utilizing these active species for initiating polymerization of some other monomer. In a case where the polymer compound providing active species forms a solid surface, the foregoing method is specially referred to as surface graft polymerization.

For the surface graft polymerization enabling the invention to materialize, any of the methods described in literature can be employed. For instance, the photo graft polymerization method and the plasma irradiation graft polymerization method are described as surface graft polymerization methods in *Shin Kobunshi Jikkengaku* 10 (which means "New Experimental Science of Polymers Volume 10"), page 135, compiled by Kobunshi Gakkai, published by Kyoritsu Shuppan Co., in 1994. Further, the methods of effecting graft polymerization by exposure to radiation, such as γ-rays and electron beams, are described in *Kyuchaku Gijutu Binran* (which means "Handbook of Adsorption Technology"), pages 203 and 695, compiled under the supervision of Mr. Takeuchi, published by NTS Co., February 1999.

As specific methods for photo graft polymerization, the methods disclosed in JP-A-63-92658, JP-A-10-296895 and JP-A-11-119413 can be adopted.

As the other means usable for forming the hydrophilic layer of polymer compound chemically bonded directly to the support surface at the polymer chain end (grafted surface layer), which is characteristic of the present lithographic printing plate support and the lithographic printing plate precursor using the present support, there is a method of introducing a reactive functional group, such as a trialkoxysilyl group, an isocyanate group, an amino group, a hydroxyl group or a carboxyl group, at the chain end of a polymer compound and making the introduced functional group undergo the coupling reaction with a functional group is present at the support surface, thereby forming a chemical bond between the polymer compound and the support surface.

Additionally, the term "support surface" relating to the present lithographic printing plate support and the present lithographic printing plate precursor refers to the layer capable of chemically binding to the end of a polymer compound containing a hydrophilic functional group directly or via a polymer backbone. More specifically, such a layer may be either a support itself or a layer specially provided on a support.

On the other hand, as a means for forming the hydrophilic layer comprising a polymer backbone chemically bonded to the support surface and a straight-chain polymer compound attached to the polymer backbone at the individual molecular chain ends, there is a method of synthesizing a grafted polymer compound from a trunk polymer having in side chains functional groups capable of coupling with functional groups present at the support surface and a hydrophilic functional group-containing polymer compound for forming graft chains, and making the synthesized polymer compound undergo coupling reaction with the functional groups present at the support surface.

Description of Hydrophilic Functional Groups

Hydrophilic functional groups contained in a hydrophilic polymer compound produced by surface graft polymerization, which constitutes the hydrophilic layer of the present lithographic printing plate support and the present lithographic printing plate precursor, and specific methods of forming the hydrophilic layer are described below.

Examples of a hydrophilic functional group suitable for the invention include a carboxylic acid group, a sulfonic acid group, a sulfinic acid group, a phosphonic acid group, an amino group or a salt thereof, an amido group, a hydroxyl group, an ether linkage, and a polyoxyethylene group.

(Specific Method of Forming Hydrophilic Layer Comprising Hydrophilic Polymer Produced by Surface Graft Polymerization)

When the graft polymerization method utilizing plasma irradiation or exposure to radiation is adopted for the surface graft polymerization, the hydrophilic layer can be formed using the method described in Y. Ikada et al, *Macromolecules*, vol. 19, pate 1804 (1986) in addition to the methods-described in the literature cited above. More specifically, the hydrophilic layer can be formed by treating a polymer film, such as a PET film, with plasma or electron beams to produce radicals at the film surface, and then making the activated surface react with a monomer containing a hydrophilic functional group. Examples of a hydrophilic functional group-containing monomer especially useful in the invention include monomers respectively containing a carboxyl group, a sulfonic acid group, a phosphonic acid group, an amino group and salts of these groups, such as (meth)acrylic acid or the alkali metal or amine salts thereof, itaconic acid or the alkali metal or amine salts thereof, 2-hydroxyethyl(meth)acrylate, (meth)acrylamide, N-monomethylol(meth)acrylamide, N-dimethylol(meth)acrylamide, allylamine or the hydrogen halide thereof, 3-vinylpropionic acid or the alkali metal or amine salts thereof, vinylsulfonic acid or the alkali metal or amine salts thereof, vinylstyrenesulfonic acid or the alkali metal or amine salts, 2-sulfoethylene(meth)-acrylate and 3-sulfopropylene(meth)acrylate or the alkali metal or amine salts thereof, polyoxyethylene glycol mono(meth)acrylate, 2-acrylamido-2-methylolpropanesulfonic acid or the alkali metal or amine salts, acid phosphoxy-polyoxyethylene glycol mono(meth)acrylate, and 2-trimethylaminoethyl(meth)acrylate or the hydrogen halide thereof.

Description of Structure of Lithographic Printing Plate Precursor

The structure of a lithographic printing plate precursor using the present lithographic printing plate support is built up of a lithographic printing plate support and an image-forming layer (a light-sensitive or heat-sensitive layer), wherein the support has on its surface a hydrophilic layer comprising a polymer compound that is chemically bonded directly to the support surface and has hydrophilic functional groups. Additionally, the term "support surface" relating to the present lithographic printing plate support and the present lithographic printing plate precursor refers to the surface having functional groups capable of chemically binding to the end of a hydrophilic functional group-containing polymer compound directly or via a polymer backbone, and such a surface may be the surface of a support itself or a layer specially provided on a support for the present lithographic printing plate precursor.

When the recording on the present image-forming layer is made by the use of heat, such as IR laser, it is desirable to incorporate a light-heat conversion material somewhere in the present lithographic printing plate precursor, especially in the hydrophilic layer, the support surface layer or the support, or between the support surface layer and the support.

(Description of Support Surface)

The term "support surface" signifies a surface suitable for grafting thereon the present polymer compound containing hydrophilic functional groups (hydrophilic polymer), and the surface may be in any state as far as it develops such a function. Specifically, the support surface may be either inorganic or organic, and the polarity thereof may be either hydrophilic or hydrophobic. Further, the support surface may form a part of the support. In this case, the support surface and the support are integrated into one body. Furthermore, the support surface having the function required in the invention can be formed by surface treatment of a support. Herein, the surface-treated support can be used as a support containing the support surface.

Additionally, as mentioned above, it is advantageous to the present lithographic printing plate support and the present lithographic printing plate precursor using the present support that the support surface, directly to which the polymer compound constituting the hydrophilic layer is chemically bonded, be roughened.

In special cases where the present hydrophilic polymers are synthesized in accordance with a method of photo graft polymerization, plasma irradiation graft polymerization or radiation exposure graft polymerization, the support prefers having an organic surface to having an inorganic surface. In particular, the support surface made of an organic polymer is advantageous over others. Examples of an organic polymer usable therefor include synthetic resins, such as epoxy resin, acrylic resin, urethane resin, phenol resin, styrene resin, vinyl resin, polyester resin, polyamide resin, melamine resin and formaldehyde resin, and natural resins such as gelatin, casein, cellulose and starch. In the cases of photo graft polymerization, plasma irradiation graft polymerization and radiation exposure graft polymerization, the graft polymerization is triggered off by drawing hydrogen atoms out of an organic polymer, so that it is favorable from the viewpoint of production suitability to use a polymer from which hydrogen atoms are easily taken away, such as acrylic resin, urethane resin, styrene resin, vinyl resin, polyester resin, polyamide resin or epoxy resin.

Of these resins, acrylic resin, urethane resin, styrene resin, polyester resin, polyamide resin and epoxy resin are preferred from a viewpoint that it can serve as both support and support surface.

Another characteristic of the present lithographic printing plate support and the lithographic printing plate precursor using the present support is in that it is advantageous for the support surface to be roughened. Then, the roughness of the support surface used in the invention is described.

Definitions of Surface Irregularities

The center line average height Ra of the two-dimensional roughness parameters is from 0.1 $\mu$m to 1 $\mu$m, the maximum height Ry is from 1 $\mu$m to 10 $\mu$m, the ten point average height Rz is from 1 $\mu$m to 10 $\mu$m, the average space of irregularities Sm is from 5 $\mu$m to 80 $\mu$m, the average space between local crests S is from 5 $\mu$m to 80 $\mu$m, the maximum height Rt is from 1 $\mu$m to 10 $\mu$m, the center line crest height Rp is from 1 $\mu$m to 10 $\mu$m, and the center line root depth Rv is from 1 $\mu$m to 10 $\mu$m.

The two-dimensional roughness parameters are based on the following definitions:

Center line average height Ra: A value obtained by sampling a portion of a measured length L in a center line direction from a roughness curve, and arithmetically averaging absolute values of the deviation of the center line of the sampled portion and the roughness curve.

Maximum height Ry: A value obtained by sampling a reference length from a roughness curve in a center line direction thereof, and measuring a space between a crest line and a root line of the sampled portion in the direction of longitudinal magnification of the roughness curve.

Ten point average height Rz: A value obtained by sampling a reference length from a roughness curve in a center line direction thereof, and representing by micrometer (μm) the sum of an average value of absolute values of altitudes Yp of crests from the highest to the fifth and an average value of absolute values of altitudes Yv of roots from the lowest to the fifth, measured in the direction of longitudinal magnification from a center line of the sampled portion.

Average space of irregularities Sm: A value obtained by sampling a reference length from a roughness curve in a center line direction thereof, determining the sum of average line lengths corresponding to one crest and one root adjacent thereto in the sampled portion, and representing an arithmetic average value of spaces between many irregularities by millimeter (mm).

Average space between local crests S: A value obtained by sampling a reference length from a roughness curve in a center line direction thereof, determining an average line length corresponding to a space between local crests adjacent to each other in the sampled portion, and representing an arithmetic average value of spaces between the many local crests by millimeter (mm).

Maximum height Rt: A space value between two straight lines, when a portion sampled from a roughness curve by a reference length is put between the two straight lines parallel to a center line of the sampled portion.

Center line crest height Rp: A space value between a center line of a portion sampled from a roughness curve by a measured length L in the direction of the center line thereof and a straight line parallel thereto and passing the highest crest.

Center line root depth Rv: A space value between a center line of a portion sampled from a roughness curve by a measured length L in the direction of the center line thereof and a straight line parallel thereto and passing the lowest root.

Preparation Method of Irregular Surface
(Kind of Preparation Method)

For forming a roughened surface on the solid surface, various means can be employed. For example, the solid surface is mechanically rubbed by sand blasting or brushing to shave the surface, thereby forming concaves. Thus, the roughened surface can be formed. Further, irregularities can also be formed by mechanical embossing. Furthermore, convexes may be formed on the surface by gravure printing to form a roughened surface. A layer containing fine solid particles (matte agent) may be formed on the solid surface by means such as coating or printing to form a roughened surface. The fine solid particles can also be contained in (internally added to) a polymer film in the stage of preparing the polymer film to form irregularities on a surface of the polymer film. Further, the roughened surface can also be formed by solvent treatment, corona discharge treatment, plasma treatment, electron beam irradiation treatment or X-ray irradiation treatment. The above-mentioned means may be employed in combination. The means for forming irregularities by sand blasting or resin printing, or the means for forming irregularities by adding fine solid particles can be particularly preferably used.

(Fine Solid Particle Method)

As the above-mentioned fine solid particles, various materials such as fine metal particles, fine metal oxide particles and fine particles of organic or inorganic polymer or low-molecular weight compounds can be utilized. Specific examples of the fine particles include copper powder, tin powder, iron powder, zinc oxide powder, silicon oxide powder, titanium oxide powder, aluminum oxide powder, molybdenum disulfide powder, calcium carbonate powder, clay, mica, corn starch, boron nitride, silicone resin particles, polystyrene resin particles, fluorine resin particles, acrylic resin particles, polyester resin particles, acrylonitrile copolymer resin particles, zinc stearate and calcium behenate. The average particle size of the fine particles is preferably 0.05 μm or more, and more preferably 0.1 μm or more. When the fine particles are adhered to a surface of the sheet or the surface of the sheet is provided with a layer containing the fine particles, the average particle size of the fine particles approximately corresponds to the size of irregularities on the roughened surface. When the fine particles are internally added to the sheet, the size of irregularities on the roughened surface depends on the average particle size of the fine particles and the thickness of the sheet. Accordingly, in the latter case, it is necessary for obtaining the optimum size of irregularities to experimentally determine the optimum particle size by combinations of sheets and fine particles.

Specific examples of methods for forming irregularities by fixing the fine solid particles to the surface of the support include methods of adding the fine solid particles before film formation to form a film, methods of applying a dispersion of the fine solid particles in a binder, followed by drying, methods of embedding the fine particles in a film by mechanical pressure after film formation, and methods of electrodepositing the fine solid particles after film formation.

Specific examples of the methods of adding the fine solid particles before film formation to form a film include the following method. A PET masterbatch containing a pigment as the fine solid particles is melt extruded onto a cooling drum to form a film, which is then oriented longitudinally and laterally in this order, and finally heat treated to provide an irregular PET film. As the pigment, one in which one or more of titanium oxide, alumina and silica are compounded can be used. The center line average surface roughness of the film can be adjusted by the particle size and amount of the pigment to be compounded. For example, it can be adjusted by compounding the pigment having a particle size of about 1 μm to about 10 μm in an amount of about 0.5% to 5% by weight. A larger particle size and amount of the pigment compounded results in a higher center line average surface roughness. For obtaining the aimed roughened surface having irregularities, it is necessary to determine the particle size of the pigment and adjust the amount thereof compounded.

(Sand Blasting Process)

Sand blasting is a process for roughening a surface of a polymer film by spraying a fine-grained abrasive on the surface of the film at high speed. Sand blasting treatment may be carried out by known methods. For example, carborundum (silicon carbide powder) or metal particles can be strongly sprayed together with compressed air, followed by washing with water and drying to attain the object. The control of the center line average surface roughness of the film by the sand blasting treatment can be carried out by adjusting the particle size and treating amount (treating frequency per area) of the particles to be sprayed. A larger particle size and treating amount of the particles results in a higher center line average surface roughness of the film surface.

More particularly, the sand blasting treatment is surface treatment conducted by spraying the abrasive on the film surface with compressed air, and the irregularities formed thereby are adjusted by the conditions of the sand blasting treatment.

The abrasive is blown off through a sand blasting blow-off nozzle to spray it on the film. As to the treating conditions, it is necessary to adjust the blow-off amount (blast amount) of the abrasive, and the angle and spacing between the sand blasting blow-off nozzle and the film (blast angle and blast distance). The abrasive in a hopper is brown off through the sand blasting blow-off nozzle by compressed air sent out of an air chamber to spray it on the film surface, thereby conducting the sand blasting treatment under conditions made proper. Specifically, these methods are described, for example, as known methods in JP-A-8-34866, JP-A-11-90827 and JP-A-11-254590.

Such treating conditions in the sand blasting treatment are required to be such conditions that the abrasive and shavings are not left on the film surface, and that the strength of the film is not reduced. Such treating conditions can be experientially appropriately established.

Specifically, silica sand and other abrasives are used as the abrasives. In particular, the use of silica sand having a particle size of 0.05 mm to 10 mm, further 0.1 mm to 1 mm is preferred. The blast distance is preferably from 100 mm to 300 mm, and the blast angle is preferably from 45 degrees to 90 degrees, and more preferably from 45 degrees to 60 degrees. Further, the blast amount is preferably from 1 kg/minute to 10 kg/minute. These are for preventing the abrasive and shavings from being left on the film surface, and further for controlling the grinding depth. The grinding depth is preferably limited to 0.01 $\mu$m to 0.1 $\mu$m, thereby being able to prevent the film from being reduced in strength.

(Thickness of Hydrophilic Layer and That of Image-forming Layer)

The suitable thickness of a hydrophilic layer is from 0.001 to 10 g/m$^2$, preferably from 0.01 to 5 g/m$^2$. When the hydrophilic layer is too thin, it cannot exhibit water-receiving effect; while, when it is too thick, its adhesiveness to an image-forming layer becomes poor to result in shortening of press life.

The suitable thickness of an image-forming layer is from 0.1 to 10 g/m$^2$, preferably from 0.5 to 5 g/m$^2$. When the image-forming layer is too thin, the press life becomes short; while, when it is too thick, the prints obtained becomes inferior in fine-line reproducibility.

Description of Image-forming Layer
(Light-sensitive Layer and Heat-sensitive Layer)

The image-forming layer (light-sensitive or heat-sensitive layer) provided on a hydrophilic layer in the invention comprises a positive-working responsive composition or a negative-working responsive composition.

(Positive-working Responsive Composition)

The positive-working responsive composition suitably used in the invention is the conventional positive-working responsive composition (a) or (b) described below:

(a) A conventional positive-working photosensitive composition comprising naphthoquinone diazide and novolak resin.

(b) A chemically amplified positive-working photosensitive composition comprising the combination of an alkali-soluble compound protected by an acid-decomposable group and an acid generator.

Both the compositions (a) and (b) are well known in this field, and it is further desirable to use them in combination with one of the positive-working responsive compositions (c) to (f) described below:

(c) A laser-responsive positive composition comprising a sulfonic acid ester polymer and an infrared absorbent, which enables the preparation of development-free lithographic printing plate as disclosed in JP-A-10-282672.

(d) A laser-responsive positive composition comprising a carboxylic acid ester polymer and an acid generator or an infrared absorbent, which enables the preparation of development-free lithographic printing plate as disclosed in European Patent 652483 or JP-A-6-502260.

(e) A laser-responsive positive composition disclosed in JP-A-11-095421, which comprises an alkali-soluble compound and a substance which, though undergoes decomposition by heating, can lower in a substantial sense the solubility of alkali-soluble compound when it is in an undecomposed state.

(f) An alkali-development elution positive-working composition comprising an infrared absorbent, novolak resin and an dissolution inhibitor, which enables the preparation of an alkali-development elution positive lithographic printing plate.

The compounds used in the positive-working responsive compositions (a) to (f) are illustrated below.

Acid Generators

The acid generators used in positive-working responsive compositions are compounds capable of generating acids when exposed to heat or light, wherein are generally included photo-initiators for photo cationic polymerization, photo-initiators for photo radical polymerization, photo decolorizing agents for dyes, photo discoloring agents and the compounds known to generate acids upon exposure to light and hitherto used for microresist. These compounds may be used alone or as a mixture thereof. The acid generators used in the invention can be selected properly from those compounds.

Examples of such acid generators include diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055 and 4,069,056, and JP-A-3-140140, phosphonium salts described in D. C. Necker et al., *Macromolecules*, 17, 2468 (1984), C. S. Wen et al., *The. Proc. Conf. Rad. Curing ASIA*, p. 478, Tokyo, October (1988), U.S. Pat. Nos. 4,069,055 and 4,069,056, iodonium salts described in J. V. Crivello et al., *Macromolecules*, 10 (6), 1307 (1977), *Chem. & Eng. News*, Nov. 28, 31 (1988), European Patents 104,143, JP-A-2-150848 and JP-A-2-29$^{6514}$, sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patent 370,693, U.S. Pat. No. 3,902,114, European Patents 233,567, 297,443 and 297,442, U.S. Pat. Nos. 4,933,377, 4,760,013, 4,734,444 and 2,833,827, and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), onium salts such as arsonium salts described in C. S. Wen et al., *The. Proc. Conf. Rad. Curing ASIA*, p. 478, Tokyo, Oct. (1988), organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1986) and JP-A-2-161445, photo acid generators having o-nitrobenzyl type protective groups described in S. Hayase et al., *J. Polymer Sci.*, 25, 753 (1987), E. Reichman et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156,535, 271,851 and 0,388, 343, U.S. Pat. Nos. 3,901,710 and 4,181,531, JP-A-60-198538 and JP-A-53-133022, compounds producing sulfonic acids by photolysis which are represented by iminosulfonates described in M. Tunooka et al., *Polymer Preprints Japan*, 35 (8),. G. Berner et al., *J. Rad. Curing*, 13 (4), W. J. Mijs et al., *Coating Technol.*, 55 (697), 45 (1983), Akzo, H. Adachi et al., *Polymer Preprints Japan*, 37 (3), European Patents 0,199,672, 84,515, 044,115 and 0,101, 122, U.S. Pat. Nos. 4,618,564, 4,371,605 and 4,431,774, JP-A-64-18143, JP-A-2-245756 and JP-A-3-140109, and disulfone compounds described in JP-A-61-166544.

Further, compounds in which the acid generators are introduced into their main chains or side chains can be used. Examples of such compounds are described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-14603, JP-A-63-163452, JP-A-62-153853 and JP-A-63-146029.

Further, compounds generating acids with light can also be used which are described in V. N. R. Pillai *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

In the invention, the amount of the acid generator added is usually from about 0.001% to about 40% by weight, preferably from 0.01% to 20% by weight, and more preferably from 0.1% to 5% by weight, based on the total solid content of light-sensitive or heat-sensitive layer.

Alkali-soluble Compounds

The alkali-soluble compounds used in positive-working responsive compositions are alkali-soluble compounds whose alkali solubility is lowered in the presence of a dissolution inhibitor and restored upon decomposition of the dissolution inhibitor.

Specifically, the alkali-soluble compounds used in positive-working responsive compositions are, e.g., novolak resin, polyhydroxystyrene and acrylic resins.

The novolak resins usable in the invention are resins produced by condensation of phenols and aldehydes under an acidic condition. Suitable examples of such novolak resins include novolak resin prepared from phenol and formaldehyde, novolak resin prepared from m-cresol and formaldehyde, novolak resin prepared from p-cresol and formaldehyde, novolak resin prepared from o-cresol and formaldehyde, novolak resin prepared from octylphenol and formaldehyde, novolak resin prepared from a mixture of m-cresol with p-cresol and formaldehyde, and novolak resin prepared from a mixture of phenol with cresol (which may be any of o-cresol, m-cresol, p-cresol and mixtures of any two thereof)and formaldehyde. Of these novolak resins, those having their weight-average molecular weight in the range of 800 to 200,000 and their number average molecular weight in the range of 400 to 60,000 are suitable for the invention.

As examples of alkali-soluble compounds, other than novolak resins, which are usable in positive-working responsive compositions, mention may be made of polyhydroxystyrenes, a copolymer of hydroxystyrene and N-substituted maleimide, a copolymer of hydroxystyrene and maleic anhydride, acrylic polymers containing alkali-soluble groups and urethane polymers containing alkali-soluble groups. Examples of alkali-soluble groups contained in the polymers recited above include a carboxyl group, a phenolic hydroxyl group, a sulfonic acid group, a phosphonic acid group and an imido group.

In the case of using hydroxystyrene polymers, such as poly(p-hydroxystyrene), poly(m-hydroxystyrene), a copolymer of p-hydroxystyrene and N-substituted maleimide and a copolymer of p-hydroxystyrene and maleic anhydride, it is desirable that their weight-average molecular weight be from 2,000 to 500,000, preferably from 4,000 to 300,000.

Examples of acrylic polymers containing alkali-soluble groups include a copolymer of methacrylic acid and benzyl methacrylate, poly(hydroxyphenylmethacrylamide), poly(hydroxyphenylcarbonyloxyethyl acrylate), poly(2,4-dihydroxyphenylcarbonyloxyethyl acrylate) and the polymers disclosed in JP-A-10-55066. The suitable weight-average molecular weight of these acrylic resins is in the range of 2,000 to 500,000, preferably 4,000 to 300,000.

As an example of urethane polymers containing alkali-soluble groups, mention may be made of the resin produced by reaction of diphenylmethane diisocyanate with hexamethylene diisocyanate, tetraethylene glycol and 2,2-bis(hydroxymethyl)propionic acid.

Of those alkali-soluble polymers, hydroxystyrene polymers and acrylic copolymers containing alkali-soluble groups are preferred over the others from the viewpoint of developability.

In the invention, the alkali-soluble compounds may be protected by acid-decomposable groups, such as ester and carbamate residues.

In the invention, the proportion of those alkali-soluble compounds to the total solids in a light-sensitive or heat-sensitive layer is from about 10 to about 90 weight %, preferably from 20 to 85 weight %, particularly preferably from 30 to 80 weight %. When the proportion of alkali-soluble compounds is smaller than 10 weight %, the resultant light-sensitive or heat-sensitive layer is inferior in durability; while the proportions greater than 90 weight % have undesirable effect upon both sensitivity and durability.

Additionally, those alkali-soluble compounds may be used alone or as a combination of two or more thereof.

Dissolution Inhibitors

The dissolution inhibitors used in positive-working responsive compositions are compounds decomposing under the action of acids to become soluble in alkalis. Examples thereof include carboxylic acids and phenol compounds protected by acid-decomposable groups of chemical amplification type employed in the resist area, such as t-butyl ester, t-butyl carbamate and alkoxyethyl ester residues.

In the invention, the proportion of dissolution inhibitors to the total solids in a light-sensitive or heat-sensitive layer is of the order of 5–90 weight %, preferably from 10 to 80 weight %.

The quinonediazide compounds suitable for the invention are o-quinonediazide compounds.

The o-quinonediazide compounds used in the invention are compounds having at least one o-quinonediazido group per molecule and increase their solubility in alkali when they undergo thermal decomposition, and they may be various in structure. More specifically, when decomposed by heating, o-quinonediazide loses a function of inhibiting the dissolution of alkali-soluble compounds, and besides, o-quinonediazide itself is converted into an alkali-soluble material. By these two effects, o-quinonediazide can help the dissolution of a sensitive system. As examples of an o-quinonediazide compound usable in the invention, mention may be made of the compounds described in J. Kosar, *Light-Sensitive Systems*, pp. 339–352, (John Wiley & Sons, Inc.). In particular, the o-quinonediazide sulfonic acid esters or amides produced by reaction with various kinds of aromatic polyhydroxy-or amino compounds are preferred over the others. In addition, the esters as disclosed in JP-B-43-28403, which are prepared from benzoquinone-(1, 2)-diazide sulfonic acid chloride or naphthoquinone-(1,2)-diazide-5-sulfonic acid chloride and pyrogallol-acetone resin, and the esters as disclosed in U.S. Pat. Nos. 3,046,120 and 3,188,210, which are prepared from benzoquinone-(1, 2)-diazide sulfonic acid chloride or naphthoquinone-(1,2)-diazide-5-sulfonic acid chloride and phenol-formaldehyde resin, are also used to advantage.

Further, the esters of naphthoquinone-(1,2)-diazide-4-sulfonic acid chloride and phenol-formaldehyde resin or cresol-formaldehyde resin and the ester of naphthoquinone-(1,2)-diazide-4-sulfonic acid chloride and pyrogallol-acetone resin are favorably used, too. As to other useful o-quinonediazide compounds, there are a great number of reports in patent-related literature. For instance, the compounds disclosed in JP-A-47-5303, JP-A-48-63802, JP-A-48-63803, JP-A-48-96575, JP-A-49-387-1, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,835, British Patents 1,227,602, 1,251,345, 1,267,005, 1,329,888 and 1,330,932, and German Patent 854,890 are useful.

In the invention, the proportion of o-quinonediazide compounds to the total solids in a light-sensitive or heat-sensitive layer is of the order of 1-50 weight %, preferably from 5 to 30 weight %, particularly preferably from 10 to 30 weight %. These compounds can be used alone or as a mixture of several kinds. When the proportion of o-quinonediazide compounds is smaller than 1 weight %, the resultant sensitive layer deteriorates in image-recording capability; while, when the proportion is greater than 50 weight %, the durability of the image area and the sensitivity are lowered.

(Negative-Working Responsive Compositions)

The following conventional negative-working responsive compositions (g) to (j) can be used in the invention:

(g) A negative-working responsive composition comprising a photo cross-linkable group-containing polymer and an azide compound, (h) A negative-working responsive composition comprising the diazo compound as disclosed in JP-A-59-101651, (i) A photo-polymerizable negative-working responsive composition comprising the combination of a photo polymerization initiator and an addition-polymerizable unsaturated compound as disclosed in U.S. Pat. No. 262,276 or JP-A-2-63054, and (j) A negative-working responsive composition comprising the combination of an alkali-soluble compound, an acid generator and an acid cross-linkable compound as disclosed in JP-A-11-095421.

The compounds used in the negative-working responsive compositions (g) to (j) are illustrated below.

Polymers Containing Photo Cross-linkable Groups

The photo cross-linkable group-containing polymers suitably used in the negative-working responsive composition are polymers containing photo cross-linkable groups having an affinity for an aqueous alkali developer, with examples including the polymers having photo cross-linkable groups, such as —CH=CH—CO—, in their main or side chains as disclosed in U.S. Pat. No. 5,064,747, the copolymers containing cinnamic acid groups and carboxyl groups as disclosed in JP-B-54-15711, the polyester resins containing phenylenediacrylic acid residues and carboxyl groups as disclosed in JP-A-60-165646, the polyester resins containing phenylenediacrylic acid residues and phenolic hydroxyl groups as disclosed in JP-A-60-203630, the polyester resins containing phenylenediacrylic acid residues and sodium iminodisulfonyl groups as disclosed in JP-B-57-42858, and the polymers containing azido groups and carboxyl groups in their side chains as disclosed in JP-A-59-208552.

In the invention, the proportion of polymers containing photo cross-linkable groups to the total solids in a light-sensitive or heat-sensitive layer is of the order of 5–100 weight %, preferably from 10 to 95 weight %, particularly preferably from 20 to 90 weight %.

Azide Compounds

As examples of an azide compound used in a negative-working responsive composition, mention may be made of 2,6-bis(4-azidobenzylidene)-4-methylcyclohexanone and 4,4'-diazidodiphenyl sulfide.

In the invention, the proportion of azide compounds to the total solids in a light-sensitive or heat-sensitive layer is of the order of 5–95 weight %, preferably from 10 to 90 weight %, particularly preferably from 20 to 80 weight %.

Alkali-soluble Compounds

The alkali-soluble compounds usable in the negative-working responsive compositions are the same ones as recited above for the positive-working responsive compositions.

Diazo Compounds

The diazo resins used in negative-working responsive compositions are, e.g., diazo resins represented by the salts of condensates prepared from diazodiarylamines and active carbonyl compounds. It is desirable for these diazo resins to be sensitive to light, insoluble in water and soluble in organic solvents.

The diazo resins used to particular advantage include the organic or inorganic acid salts of condensates prepared from diazodiphenylamines, such as 4-diazodiphenylamine, 4-diazo3-methyldiphenylamine, 4-diazo-4'-methyl-dipheny-lamine, 4-diazo-3'-methyldiphenylamine, 4-diazo-4'-methoxy-diphenylamine, 4-diazo-3-methyl-4'-ethoxydipheny-lamine and 4-diazo-3-methoxydiphenylamine, and active carbonyl compounds, such as formaldehyde, para-formaldehyde, acetoaldehyde, benzaldehyde and 4,4'-bis-methoxymethyl-diphenyl ether.

Examples of an organic acid used for the foregoing salts include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid and 2-hydroxy-4-methoxy-benzo-phenone-5-sulfonic acid; while those of an inorganic acid include hexafluorophosphoric acid, tetrafluoroboric acid and thiocyanic acid.

In addition, the diazo resin containing a polyester residue as the main chain as disclosed in JP-A-54-30121, the diazo resin produced by reacting a polymer having carboxylic acid anhydride residues with a hydroxyl group-containing diazo compound as disclosed in JP-A-61-273538 and the diazo resin produced by reacting a polyisocyanate compound with a hydroxyl group-containing diazo compound are also usable.

In the invention, the suitable proportion of diazo resin to the total solids in a light-sensitive or heat-sensitive layer is of the order of 0–40 weight %. Two or more of the diazo resins as recited above may be used in combination, if needed.

Photo Polymerization Initiators and Addition-polymerizable Unsaturated Compounds As examples of an addition-polymerizable unsaturated compound and a photo polymerization initiator used in the negative-working responsive composition, mention may be made of the at least two terminal ethylene groups-containing addition-polymerizable unsaturated compounds and the photo polymerization initiators as disclosed in U.S. Pat. Nos. 2,760,863 and 3,060,023, and JP-A-62-121448.

In the invention, the proportion of addition-polymerizable unsaturated compounds to the total solids in a light-sensitive or heat-sensitive layer is of the order of 5–95 weight %, preferably from 5 to 80 weight %. And the proportion of photo polymerization initiators to the total solids in a light-sensitive or heat-sensitive layer is of the order of 1–80 weight %, preferably from 5 to 50 weight %.

Acid Generators

The acid generators used in the negative-working responsive composition are the same ones as used in the positive-working responsive compositions described above.

Acid Cross-linkable Compounds

The acid cross-linkable compounds used in the negative-working responsive composition mean the compounds which can be cross-linked in the presence of an acid, with examples including aromatic compounds and heterocyclic compounds polysubstituted by hydroxymethyl, acetoxymethyl or alkoxymethyl groups. Of such compounds, the compounds produced by condensation of phenols and aldehydes under a basic condition are preferred over the others.

Examples of such a condensation product include the compound produced by condensing phenol and formaldehyde under a basic condition, the compound produced from m-cresol and formaldehyde similarly to the above, the compound produced from bisphenol A and formaldehyde similarly to the above, the compound produced from 4,4'-bisphenol and formaldehyde similarly to the above, and the compounds disclosed as resol resins in GB Patent 2,082,339.

It is advantageous for these acid cross-linkable compounds to have their weight-average molecular weight in the range of 500 to 100,000 and their number average molecular weight in the range of 200 to 50,000.

As other suitable examples, mention may be made of the aromatic compounds substituted with alkoxymethyl or oxiranylmethyl groups as disclosed in EP-A-0212482, the monomeric and oligomeric melamine-formaldehyde condensates and the urea-formaldehyde condensates as disclosed in EP-A-0133216, DE-A-3634671 and DE 3,711,264, and the alkoxy-substituted compounds disclosed in EP-A-0212482.

Besides the compounds recited above, the melamine-formaldehyde derivatives having at least two free N-hydroxymethyl, N-alkoxymethyl or N-acyloxymethyl groups are favorable. In particular, N-alkoxymethyl derivatives are preferred over the others.

On the other hand, low molecular weight or oligomeric silanols can be used as a silicon-containing cross-linking agent. Examples of such an agent include dimethylsilanediol, diphenylsilanediol, and the oligomers already precondensed to contain those units, such as those disclosed in EP-A-0377155.

Description of Sensitive Layer

Then, the sensitive layer constituting the present lithographic printing plate precursor, which comprises a polymer compound having a functional group capable of changing the hydrophobic or hydrophilic property upon exposure to heat, acid or radiation (hereinafter referred to as a polarity conversion group), is illustrated below.

The polarity conversion groups are divided into two classes, one class constituted of functional groups changing their properties from hydrophobic to hydrophilic and the other class constituted of functional groups changing their properties from hydrophilic to hydrophobic.

(Polymers Having in Their Side Chains Functional Groups Capable of Changing Their Properties From Hydrophobic to Hydrophilic)

Of polymers having side chains capable of changing their hydrophilic or hydrophobic properties, polymers having in their side chains functional groups capable of changing their properties from hydrophobic to hydrophilic are illustrated first.

Examples of such polymers include the sulfonic acid ester polymers and sulfonamide polymers disclosed in JP-A-10-282672 and the carboxylic acid ester polymers disclosed in European Patent 0 652 483, JP-A-6-502260 and JP-A-7-186562.

Of those polymers having side chains whose properties can be changed from hydrophobic to hydrophilic, secondary sulfonic acid ester polymers, tertiary carboxylic acid ester polymers and carboxylic acid alkoxyalkyl ester polymers are used to particular advantage.

Description of Ablative Ink-receiving Layer (Image-forming Layer)

Then, the ablative ink-receiving layer provided as the upper layer of the foregoing hydrophilic layer is described.

The term "ablative" as used herein does not means that all the recording layer constituents in the irradiated area disappear in the stage of irradiation, and does not necessarily means that a substantial decrease in mass occurs in the stage of irradiation. The phenomenon produced by irradiation is characterized by a form change caused in the solid-state recording layer, and this form change suggests that the structure of the layer is destroyed in a substantial sense. Scientifically speaking, such a phenomenon includes ablation, evaporation and fusion, but does not necessarily involve a decrease in mass. However, the form change in the invention is required to bring about at least partial removal of the irradiated area of the ink-receiving layer in the irradiation stage in some cases or, in the other cases, in the after-treatment or printing stage. Such form change can be confirmed by various microscopic techniques, and the present recording layer is required to have capability to cause at least such a form change.

As the ink-receiving layer having such a characteristic, any of ink-receptive solid thin films and organic thin films are suitably used so long as they can absorb irradiated light, and they can be chosen from materials known in the fields of graphic arts, metal machining and laser beam machining. To the ink-receiving layer, it is generally advantageous to have the highest possible absorbance and the thinnest possible thickness from the viewpoints of press plate capabilities and drawing speed (sensitivity). When the ink-receiving layer has low absorbance with respect to the irradiated light, the quantity of heat evolved by light-heat conversion is small and so the sensitivity is lowered. When the layer has a great thickness, on the other hand, the removal thereof requires much heat; as a result, the sensitivity is lowered, or scum develops upon printing due to incomplete removal. The suitable absorbance is at least 0.1, preferably at least 0.5. The suitable thickness depends largely on the constituents of the ink-receiving layer. Specifically, in the case of inorganic solid thin films (metal films) as mentioned below, the suitable thickness thereof is at most 5,000 Angstrom, preferably at most 1,000 Angstrom; while in the case of organic thin films the suitable coverage is at most 500 mg/m², preferably at most 100 mg/m². The lower limit of the film thickness depends on the absorbance, so it can be determined so as to achieve the absorbance of at least 0.1.

The solid thin films usable for the present ink-receiving layer include various inorganic solid thin films as disclosed in JP-A-55-113307 and JP-A-52-37104. More specifically, thin films of metals, such as Mg, Sc, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Pb, Sn, As, Sb, Bi, Se and Te, are suitable as solid thin films. Of these metal films, Mg, Ti, Cr, Cu, Ag, Zn, Al, In, Sn, Bi and Te thin films are advantageous over the others from the viewpoint of sensitivity. Besides these metal films, the thin films of compounds formed by changing oxidation states of the above-recited metals on an as required basis (e.g., oxygen compounds, nitrogen compounds), stainless steel, brass, chalcogen substances (e.g., S and Se simple substances), binary chalcogen alloys (e.g., As—S, As—Se, As—Te, S—Se, Sb—Se, Sb—Te, Bi—S, Bi—Se, Bi—Te, Ge—S and Sn—S alloys), ternary chalcogen alloys (e.g., As—S—Te, As—Se—Te and Ge—Sn—S alloys) and graphite can be used, too. In addition, inorganic thin films prepared by modifying the above-recited metallic thin films as required by the use of oxidation or doping techniques are also suitably used.

These inorganic thin films each can be formed on a support by the use of not only general techniques, including a dry technique, such as evaporation (e.g., by resistance heating or electron beam irradiation), sputtering or ion plating, and a wet coating technique, such as electrochemical deposition or sol-gel method, but also a silver halide diffusion transfer development process. However, the effects of the invention are independent on the film forming method adopted.

In the case of using an organic thin film as the ink-receiving layer, the organic thin film contains an appropriate light absorbent. In general the organic thin film is constituted of a film-forming binder resin and a light absorbent, but one compound in which those two ingredients are chemically bonded may be used if desired.

Any of commonly known binder resins can be used as he binder resin to constitute an organic thin film without articular restrictions. Examples of a usable binder resin include novolak resins (such as phenol-formaldehyde resin and cresol-formaldehyde resin), urea-formaldehyde resins, melamine-formaldehyde resins, alkyd resins, (meth)acrylic resins (such as polymethyl methacrylate and polyethyl acrylate), styrene resins (such as polystyrene and poly(α-methylstyrene)), polyamide resins (such as nylons), polyester resins, polyurethane resins, polyurea resins, polycarbonate resins, silicone resins, polyvinyl alcohol esters (such as polyvinyl acetate), polyvinyl alcohol acetals (such as polyvinyl butyral), vinyl resins (such as polyvinyl chloride), polyalkenes (such as polyethylene), styrene-butadiene resins, polyvinylidene chlorides, fluorine-containing resins, polyorganosiloxanes (such as polydimethylsiloxane), and biopolymers (such as polysaccharide, oligosaccharide and polypeptide) and derivatives thereof (such as cellulose acetate and cellulose acetate butyrate).

All the compounds capable of absorbing light energy radiation usable for recording can be utilized as the light absorbent comprised in an organic thin film without any restriction. In the production of a printing plate by the use of infrared laser, the suitable light absorbent is an infrared absorbent. Examples of an infrared absorbent preferably used therein include light-heat conversion materials as recited hereinafter.

Examples of a polymer having in its side chains functional groups capable of changing their properties from hydrophilic to hydrophobic include the polymers having ammonium salt groups disclosed in JP-A-6-317899 and polymers having decarboxylation-type polarity conversion groups represented by the following formula (1) including the sulfonyl acetic acids disclosed in Japanese Patent Application No. 11-118295:

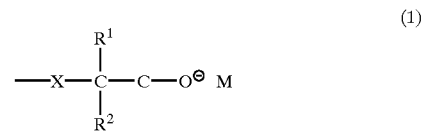

wherein X represents —O—, —S—, —Se—, —NR³—, —CO—, —SO—, —SO₂—, —PO—, —SiR³R⁴— or —CS—; R¹, R², R³ and R⁴ each represent a monovalent group; and M represents an ion bearing positive charge.

Examples of a monovalent group represented by R¹, R², R³ and R⁴ each include —F, —Cl, —Br, —I, —CN, —R⁵, —OR , —OCOR⁵, —OCOOR⁵, —OCONR⁵R⁶, —OSO₂R⁵, —COR⁵, —COOR⁵, —CONR⁵R⁶, —NR⁵R⁶, —NR⁵—COR⁶, —NR⁵—COOR⁶, —NR⁵—CONR⁶R⁷, —SR⁵, —SOR⁵, —SO₂R⁵ and —SO₃R⁵.

Examples of R⁵, R⁶ and R⁷ each include hydrogen, an alkyl group, an aryl group, an alkenyl group and an alkynyl group. Examples of these functional groups include those recited above.

Other Ingredients

To the light-sensitive or heat-sensitive layer of the present lithographic printing plate precursor, various compounds other than the compounds recited above may be added if required for imparting the intended characteristics to the lithographic printing plate.

In the light-sensitive or heat-sensitive layer of the present lithographic printing plate precursor, dyes showing great absorption in the visible region can be used as an image-coloring agent.

Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (all of these dyes are products of Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes disclosed in JP-A-62-293247.

The addition of those dyes are preferable because it enables a clear discrimination between image and non-image areas. Additionally, the suitable proportion of dyes to the total solids in the light-sensitive or heat-sensitive layer is from 0.01 to 10 weight %.

To the light-sensitive or heat-sensitive of the present lithographic printing plate precursor, the nonionic surfactants as disclosed in JP-A-62-251740 and JP-A-3-208514 or the amphoteric surfactants as disclosed in JP-A-59-121044 and JP-A-4-13149 can be added for the purpose of permitting greater latitude in developing conditions.

Examples of such nonionic surfactants include sorbitan tristearate, sorbitan monopalmitate, sorbitan trioleate, stearic acid monoglyceride, and polyoxyethylene nonyl phenyl ether.

Examples of such amphoteric surfactants include alkyldi(aminoethyl)glycine, alkylpolyaminoethylglycine hydrochloride, 2-alkyl-N-carboxyethyl-N-hydroxyethylimida-zolium betaine and N-tetradecyl-N,N-betaines (e.g., Amorgen K, trade name, a product of Dai-ichi Kogyo Seiyaku Co., Ltd.). The suitable proportion of such nonionic and amphoteric surfactants in the light-sensitive or heat-sensitive layer of the present lithographic printing plate precursor is from 0.05 to 15 weight %, preferably from 0.1 to 5 weight %.

Further, plasticizers can be added to the light-sensitive or heat-sensitive layer of the present lithographic printing plate precursor if needed to impart pliability to the coating. Examples of plasticizers used for such a purpose include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer and polymer of acrylic acid or methacrylic acid.

In addition to the additives recited above, the onium salts as recited hereinbefore, haloalkyl-substituted s-triazines, epoxy compounds, vinyl ethers, and the hydroxymethyl group-containing phenol compounds and alkoxymethyl group-containing phenol compounds may also be added.

In the invention, the light-sensitive or heat-sensitive layer is generally formed by dissolving the ingredients as recited above in a proper solvent and coating the resulting solution on the hydrophilic layer. Examples of a solvent usable therein include ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxy-ethane, methyl lactate, ethyl lactate, N,N-dimethylacetamide, N,N-dimethylformamide, tetramethylurea, N-methylpyrrolidone, dimethyl sulfoxide, sulfolane, y-butyrolactone, toluene and water. However, the solvents usable in the aforementioned step should not be construed as being limited to those examples. Those solvents may be used alone or as a mixture of two or more thereof. The suitable concentration of the foregoing ingredients (the total ingredients including additives) in the solvent is from 1 to 50 weight %. And the suitable amount of coating obtained on the hydrophilic layer after drying (or the dry coverage), though depends on the desired purpose, is generally from 0.5 to 5.0 $g/m^2$ in the case of a lithographic printing plate precursor. As examples of a coating method usable therein, mention may be made of bar coater coating, spin coating, spray coating, curtain coating, dip coating, air knife coating, blade coating and roll coating. The smaller the coverage, the higher the apparent sensitivity becomes, but the farther the film characteristics of the image-recording layer deteriorate.

To the light-sensitive or heat-sensitive layer of the present lithographic printing plate precursor, surfactants for improving the coating suitability, e.g., the fluorine-containing surfactants disclosed in JP-A-62-170950, can be added. The suitable proportion of such surfactants to the total solids in the light-sensitive or heat-sensitive layer is from 0.01 to 1 weight %, preferably from 0.05 to 0.5 weight %.

The support used in the invention, though has no particular restriction, is a dimensionally stable sheet material. Examples of such a material include paper, paper laminated with plastic (e.g., polyethylene terephthalate, polyethylene, polypropylene, polystyrene), a metal sheet (e.g., an aluminum, zinc or copper sheet), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or plastic film on which the metal as recited above is laminated or evaporated.

Of these materials, polyester film or aluminum sheet is preferred as the support used in the invention. In particular, polyester film is used to advantage because it can serve as the present support surface also.

Additionally, when the support material used for the present lithographic printing plate support and a lithographic printing plate precursor using such a support serves as the support surface also, the support surface conditions described hereinbefore in detail can be applied thereto. For instance, as mentioned above, it is advantageous for the support surface to be roughened.

The aluminum sheets suitably used in the invention include a pure aluminum sheet and alloy sheets containing aluminum as a main component and very small amounts of foreign elements. Further, aluminum-laminated or evaporated plastic films may be included therein. Examples of foreign elements contained in aluminum alloys include silicon, iron, manganese, copper, magnesium, chromium, zinc, bismuth, nickel, and titanium. The proportion of foreign elements in the alloy is at most 10% by weight. Although the pure aluminum sheet is most advantageous to the invention, the production of perfectly pure aluminum is difficult in view of the present smelting techniques. Such a being case, the aluminum sheet may contain trace amounts of foreign elements. Thus, the aluminum sheet applied to the invention has no particular restriction as to the composition, but hitherto known conventional aluminum sheets can be used. The suitable thickness of the aluminum sheet used in the invention is from about 0.1 mm to about 1.5 mm, preferably from 0.15 mm to 0.4 mm, particularly preferably from 0.2 mm to 0.3 mm.

(Light-heat Conversion Materials)

When images are recorded on the present lithographic printing plate precursor by means of, e.g., IR laser, it is effective to incorporate a light-heat conversion material for converting the light energy to heat energy into a certain section of the lithographic printing plate precursor. Specifically, the light-heat conversion material may be incorporated into the hydrophilic layer, the support surface layer or the support, or between the support surface layer and the support.

In the lithographic printing plate precursors of the invention, as the light-heat conversion materials which may be contained, all materials can be used, as long as they can absorb light rays such as ultraviolet rays, visible light rays, infrared rays and white light rays to convert them to heat. Examples thereof include carbon black, carbon graphite, pigments, phthalocyanine pigments, iron powder, graphite powder, iron oxide powder, lead oxide, silver oxide, chromium oxide, iron sulfide and chromium sulfide. Particularly preferred are dyes, pigments or metals effectively absorbing infrared rays having a wavelength of 760 nm to 1,200 nm.

As the dyes, commercial dyes and known dyes described in literatures (for example, *Senryo Binran*, edited by Yuki Gosei Kagaku Kyokai, 1970) can be utilized. Specific examples thereof include azo dyes, metal complex salt dyes, pyrazolone azo dyes, anthraquinone dyes, phthalocyanine dyes, carbonium dyes, quinoneimine dyes, methine dyes, cyanine dyes and metal thiolate complexes. Preferred examples of the dyes include cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792 and cyanine dyes described in British Patent 434,875.

Further, near infrared absorption sensitizers described in U.S. Pat. No. 5,156,938 are also preferably used. In addition, substituted arylbenzo(thio)pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475 and pyrylium compounds described in JP-B-5-13514 and JP-B-5-19702 are also preferably used. Other preferred examples of the dyes include near infrared absorption dyes represented by formulas (I) and (II) in U.S. Pat. No. 4,756,993. Of these dyes, particularly preferred are cyanine dyes, squarylium dyes, pyrylium salts and nickel thiolate.

The pigments used in the invention are commercial pigments and pigments described in *Color Index (C. I.) Binran, Saishin Ganrvo Binran* (edited by Nippon Ganryo Gijutsu Kyokai, 1977), *Saishin Ganryo Ovo Gijutsu* (CMC Shuppan, 1986) and *Insatsu Ink Gijutsu* (CMC Shuppan, 1984). As to the kind of pigment, there are black pigments, yellow pigments, orange pigments, brown pigments, red pigments, purple pigments, blue pigments, green pigments, fluorescent pigments, metal powder pigments and polymer binding dyes. Specifically, the dyes which can be used include insoluble pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dye lake pigments, azine pigments, nitroso pigments, nitro pigments, natural pigments, fluorescent pigments, inorganic pigments and carbon black. Of these pigments, preferred is carbon black.

These dyes and pigments can be used in an amount of 0.01% to 50% by weight, preferably 0.1% to 10% by weight, based on the total solid content of light-heat conversion material-containing layer. The dyes can be particularly preferably used in an amount of 0.5% to 10% by weight, and the pigments can be particularly preferably used in an amount of 3.1% to 10% by weight. When the amount of the pigments or dyes is less than 0.01% by weight, the sensitivity is lowered. On the other hand, exceeding 50% by weight results in the decreased film strength of the light-heat conversion material-containing layers.

Developer

Of the present lithographic printing plate precursors, those requiring alkali development is subjected to development with an alkaline water solution after heating treatment is carried out as the need arises.

As a developer and a replenisher used for alkali development, conventional aqueous alkali solutions can be employed. Examples of alkali agents comprised in such solutions include inorganic alkali salts, such as sodium silicate, potassium silicate, tertiary sodium phosphate, tertiary potassium phosphate, tertiary ammonium phosphate, secondary sodium phosphate, secondary potassium phosphate, secondary ammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide, and organic alkali agents, such as monomethylamine, dimethylamine, trimethylamine, monoethy-lamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents may be used alone or in combination of two or more thereof.

Now, the invention is illustrated in greater detail by reference to the following examples, but it should be understood that these examples are not to be construed as limiting the scope of the invention in any way.

EXAMPLE 1

Positive-working Light-sensitive Lithographic Printing Plate Precursor:

(Formation of Hydrophilic Layer)

A 188 μm-thick biaxially stretched polyethylene terephthalate film (A4100, produced by Toyobo Co., Ltd.) was employed for both support surface and support, and subjected to oxygen glow treatment using a lithographic magnetron sputtering apparatus (Model CFS-10-EP70, made by Shibaura Eletec Corporation) under the conditions described below: Initial vacuum; 9×10E-6 torr, Oxygen pressure; 6.8×10E-3 torr, RF glow; 1.5 KW, Treatment time; 60 sec. Then, the glow-treated film was immersed in a 70° C. water solution of acrylic acid (10 weight %) for 7 hours as a stream of nitrogen is bubbled through the solution, followed by 8-hour washing with water. Thus, the acrylic acid polymer was grafted on the film surface to form a hydrophilic layer. The contact angle of the thus formed hydrophilic layer was found to be 120 (water drop in the air, Model CA-Z made by Kyowa Kaimen Kagaku Co., Ltd.).

On the thus formed hydrophilic layer, the following image-forming layer was coated as a positive-working photoreceptive layer to prepare a positive-working light-sensitive lithographic printing plate precursor. The printing plate precursor thus prepared was subjected sequentially to exposure and development, and further to evaluation of printing capability.

(Formula of Image-forming Layer)

Alkali-soluble Polymer of Naphthoquinone-1,2-diazide Type (Conventional Positive-working Type):

A composition constituted of 0.9 g of an ester compound prepared from naphthoquinone-1,2-diazide-4-sulfonyl chloride and pyrogallol-acetone resin, 0.05 g of Victoria Blue BOR, 2./0 g of novolak resin prepared from cresol and formaldehyde (m-cresol/p-cresol ratio: 6/4, weight-average molecular weight: 1,800), 20 g of methyl ethyl ketone and 7 g of methyl alcohol was coated on the hydrophilic layer formed above, thereby preparing a positive-working lithographic printing plate precursor (Sample of Example 1).

The thus prepared plate precursor was exposed by means of a PS light via a step guide made by Fuji Photo Film Co., Ltd., developed by means of an automatic processor loaded with a developer DP-4 produced by Fuji Photo Film Co., Ltd. (diluted with water by a factor of 8), and then served for printing with a printing press Heidel KOR-D. As a result, a good printing of 4,000 sheets having no scum on the non-image area was obtained.

EXAMPLES 2 TO 5

Light-sensitive lithographic printing plate precursors were prepared in the same manner as in Example 1 except that the monomers shown in Table 1 were used respectively in place of acrylic acid as a hydrophilic monomer, and subjected to exposure, development and printing capability evaluation in the same ways as in Example 1. Evaluation results are shown in Table 1.

TABLE 1

| Example | Hydrophilic monomer | Contact angle (degree) of hydrophilic layer | Printing capability (scum on 6000th print) |
|---|---|---|---|
| 2 | Acrylamide | 10 | no scum |
| 3 | 2-Acrylamido-2-methylpropane-sulfonic acid | 15 | no scum |
| 4 | Sodium 4-styrene-sulfonate | 8 | no scum |
| 5 | 2-Hydroxyethyl-acrylate | 13 | no scum |

EXAMPLE 6

Negative-working Heat-sensitive Lithographic Printing Plate precursor

The same support and hydrophilic layer as in Example 1 were used. On the hydrophilic layer, the composition according to the following formula was coated to form a heat-sensitive layer as image-forming layer, thereby preparing a negative-working heat-sensitive lithographic printing plate precursor. The thus prepared plate precursor was subjected to exposure, development and printing capability evaluation in the same ways as in Example 1.

(Formula of Image-forming Layer)

A composition constituted of 0.1 g of IRG22 (an IR dye, produced by Nippon Kayaku Co., Ltd.), 0.21 g of a cross-linking agent A described below, 2.1 g of phenol-formaldehyde novolak resin (weight-average molecular weight: 12,000), 0.02 g of diphenyliodonium-9,10-dimethoxyanthracenesulfonate, 0.06 g of Megafac F-176 (a fluorine-containing surfactant, produced by Dai-Nippon Ink and Chemicals, Inc.), 15 g of methyl ethyl ketone and 12 g of 2-methoxy-1-propanol was coated on the same hydrophilic layer as in Example 1 to prepare a negative-working heat-sensitive lithographic printing plate precursor (Sample of Example 6).

The thus prepared negative printing plate precursor of Example 6 was exposed using semiconductor laser as heat-mode laser (wavelength: 825 nm, beam diameter: $1/e^2=6$ $\mu$m) under a condition that the linear speed was set at 8 m/sec and the output was adjusted so as to apply a power of 110 mW to the plate surface. After exposure, the plate precursor was heated at 110° C. for 1 minute, and processed by being passed through an automatic processor loaded with a developer DP-4 (1:8) and a rinsing solution FR-3 (1:7), which are both products of Fuji Photo Film Co., Ltd. Then, the surface of the thus made plate was treated with Gum GU-7 (1:1) produced by Fuji Photo Film Co., Ltd., and served for printing with a printing press Heidel KOR-D. As a result, a good printing of 6,000 sheets having no scum on the non-image area was obtained.

Further, the negative-working lithographic printing plate precursor of Example 6 was stored at 45° C. under relative humidity of 75%, and then processed in the same way as described above. Similarly to the above, good printing free of scum on the non-image area was obtained, but the number of printed sheets free of scum was 5,000.

(Synthesis of Cross-linking Agent A)

1-[α-Methyl-α-(4-hydroxyphenyl)ethyl]-4-[α,α-bis(4-hydroxyphenyl)ethyl]benzene in an amount of 20 g was dissolved in 100 ml of a 10% aqueous solution of potassium hydroxide. While stirring this reaction solution at room. temperature, 60 ml of formaldehyde (37%) was added dropwise thereto over a 1-hour period. The resulting solution was stirred for additional 6 hours at room temperature, and then poured into a water solution of sulfuric acid to cause crystallization. The paste-state precipitate thus obtained was washed with water, and recrystallized from 30 ml of methanol to give a white powder in a yield of 20 g.

The thus obtained compound was identified by NMR as the hexamethylol compound of 1-[α-methyl-α-(4-hydroxyphenyl)-ethyl]-4-[α,α-bis(4-hydroxy-phenyl)ethyl] benzene. The purity of this hexamethylol compound was 92% by measurement with reversed-phase HPLC (column: shimpac CLC-ODS, made by Shimadzu Corporation, solvent: methanol/water=60/40→90/10). This hexamethylol compound in an amount of 20 g was warmed and dissolved in 1,000 ml of methanol, admixed with 1 ml of concentrated sulfuric acid, and refluxed for 12 hours under heating. Then, the reaction solution was cooled, admixed with 2 g of potassium carbonate, stirred, condensed, admixed with 300 ml of ethyl acetate, washed with water, and further dried. After removal of the solvent therefrom, 22 g of white solid was obtained.

The thus obtained compound was identified by NMR as the hexamethoxymethylol compound of 1-[α-methyl-α-(4-hydroxy-phenyl)ethyl]-4-[α,α-bis(4-hydroxy-phenyl) ethyl]-benzene.

The purity of this hexamethoxymethyl compound was 90% by measurement with reversed-phase HPLC (column: shimpac CLC-ODS, made by Shimadzu Corporation, solvent: methanol/water=60/40→90/10).

Each of the lithographic printing plate precursors prepared in Examples 1 to 6 according to the invention gave a good printing of at least 4,000 sheets which had no scum on the non-image area, namely they each achieved satisfactory results.

EXAMPLE 7

Positive-working Light-sensitive Lithographic Printing Plate Precursors

Preparation of (Support 1–5+Hydrophilic Layer)

Each of the following surface-roughened supports 1 to 5 was used, and thereon the acrylic acid polymer was grafted using a photo grafting method to form a hydrophilic layer. The contact angle of the thus formed hydrophilic layer was found to be 10° (water drop in the air, Model CA-Z made by Kyowa Kaimen Kagaku Co., Ltd.).
(Photo Grafting Method)

A photo graft polymerization solution constituted of 50 g of acrylic acid, 0.03 g of sodium periodate and 200 g of water was placed in a Pyrex glass container, and therein each of the following PET films was immersed. The air in the container was replaced with Ar gas, and then the immersed film was exposed to light for 30 minutes by means of a 400 W high-pressure mercury lamp (UVL-400P, made by Riko Kagaku Sangyo co., Ltd.) placed at a distance of 10 cm. The film having undergone the reaction was washed with 40° C. water over a period of 8 hours.

Surface-roughened Supports 1 to 5

(Support 1)

A 188 μm-thick sandblasted PET film having a surface roughness Ra (center-line average roughness) of 0.7 μ and Ry (maximum height roughness) of 7 μ (a product of Panac Kogyo Co., Ltd.).
(Support 2)

A 188 μm-thick PET film formed from polyethylene terephthalate mixed with 3.5 weight % of silica having an average particle size of 1.2 μm, which had a center-line average surface roughness of 0.18 μm.
(Support 3)

A 188 μm-thick PET film formed from polyethylene terephthalate mixed with 1.0 weight % of alumina having an average particle size of 3.5 μm, which had a center-line average surface roughness of 0.28 μm.
(Supports 4 and 5)

188 μm-thick sandblast-treated PET films having the two-dimensional surface roughness shown in Table 2.

TABLE 2

| Parameters | Support 4 Contact stylus type two dimensions | Support 5 Contact stylus type two dimensions |
| --- | --- | --- |
| Ra | 0.21 μm | 0.31 μm |
| Ry | 1.85 μm | 2.9 μm |
| Rz | 1.54 μm | 2.3 μm |
| Sm | 19 μm | 19 μm |
| S | 13 μm | 13 μm |
| Rt | 1.9 μm | 2.9 μm |
| Rp | 1.4 μm | 1.5 μm |
| Rv | 3.1 μm | 3.5 μm |

On the hydrophilic layers formed in the foregoing manners, the same image-forming layer as in Example 1 was coated to prepare positive-working lithographic printing plate precursors of Examples 7 to 11 respectively. These plate precursors were each subjected to exposure, development and printing capability evaluation in the same ways as adopted in Example 1. The results of printing capability evaluation are shown in Table 3. Each of the printing plates thus made gave a good printing of 20,000 sheets having no scum on the non-image area.

TABLE 3

| Example | Plate precursor | Hydrophilic layer | Support | Printing results |
| --- | --- | --- | --- | --- |
| 7 | 7 | Grafted acrylic acid polymer | 1 | no scum |
| 8 | 8 | ditto | 2 | no scum |
| 9 | 9 | ditto | 3 | no scum |
| 10 | 10 | ditto | 4 | no scum |
| 11 | 11 | ditto | 5 | no scum |

EXAMPLE 12

Negative-working Light-sensitive Lithographic Printing Plate Precursor

The same support and hydrophilic layer as in Example 7 were used. On the hydrophilic layer, the composition used in Example 6 was coated to form a light-sensitive layer as image-forming layer, thereby preparing a negative-working light-sensitive lithographic printing plate precursor. The thus prepared plate precursor was subjected to exposure, development and printing capability evaluation in the same ways as in Example 6. As a result, a good printing of 20,000 sheets having no scum on the non-image area was obtained.

Further, the negative-working lithographic printing plate precursor of Example 12 was stored at 45° C. under relative humidity of 75%, and then processed in the same way as described above. Similarly to the above, good printing free of scum on the non-image area was obtained, but the number of printed sheets free of scum was 7,000.

Each of the lithographic printing plate precursors prepared in Examples 7 to 12 according to the invention gave a good printing of 20,000 sheets which had no scum on the non-image area, namely they each achieved satisfactory results.

EXAMPLE 13

Positive-working Light-sensitive Lithographic Printing Plate Precursor

The same support and hydrophilic layer as in Example 1 were used. On the hydrophilic layer, the following composition was coated to form a sensitive layer as image-forming layer, thereby preparing a positive-working light-sensitive lithographic printing plate precursor. The thus prepared plate precursor was subjected to exposure and printing capability evaluation as follows.

(Formula of Sensitive Layer, Sulfonic Acid Ester Type)

A composition-constituted of 0.4 g of a sulfonic acid ester polymer exemplified below as (1p-2), 40 mg of an IR dye IRG 22 (trade name, produced by Nippon Kayaku Co., Ltd.) and 4.0 g of methyl ethyl ketone.

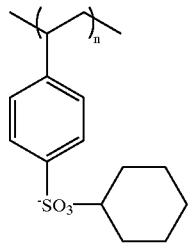

(1p-2)

The positive working lithographic printing plate prepared in Example 13 was exposed by means of Pearl Setter 908 nm IR laser made by Presstek Co. Ltd. (output: 1.2 W, main scan speed; 2M/sec), mounted in a printing press without aftertreatment, and then subjected to printing operations. The printing machine used was Ryoubi 3200, the fountain solution used was 1/100 solution of EU-3, and the printing ink used was Ink F Gloss India Ink. Even after 1,000 sheets of printed matter was printed from the present printing plate, no scum developed and clear printed matter was obtained.

EXAMPLE 14

Negative-working Heat-sensitive Lithographic Printing Plate Precursor

The same support and hydrophilic layer as prepared in Example 7 were used. On the hydrophilic layer, the same image-forming layer as in Example 13 was coated to prepare a negative-working heat-sensitive lithographic printing plate precursor, except that 1p-2 was replaced by P-1 shown below and methyl ethyl ketone as solvent was replaced by methanol in the composition according to the formula for the sensitive layer as a heat-sensitive layer. The plate precursor thus produced was subjected to scanning exposure and examined for printing properties.

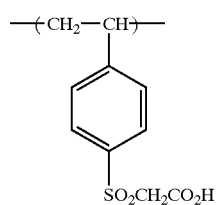

(P-1)

As a result, at least 5,000 sheets of good printed matter having no scum in the non-image area were obtained.

EXAMPLE 15

Lithographic Printing Plate Precursor

The same support and hydrophilic layer as in Example 1 were used. On the hydrophilic layer, the following composition was coated to form an ablative ink-receptive layer as image-forming layer, thereby preparing a lithographic printing plate precursor. The thus prepared plate precursor was subjected to exposure and printing capability evaluation as follows.

Ablative Ink-receiving Layer 1

Chromium was sputtered in a 30 nm-thick film under an argon atmosphere of 399 mmPa by means of a flatbed magnetron sputtering apparatus (CFS-10-EP 70, made by Shibaura Eletec Corporation).

Impression Capacity Evaluation

The thus produced lithographic printing plate precursor was subjected to 175 lpi halftone image exposure using the semiconductor laser having a wavelength of 1064 nm and a beam diameter of 25 microns at a main scanning speed of 3 m/sec. The thus exposed plate was mounted in a printing press Heidel KOR-D without development processing, and underwent printing operations. As a result, 9,000 sheets of good printed matter having no scum in the non-image area were obtained.

In accordance with the invention, as mentioned above, the lithographic printing plate support has thereon a hydrophilic layer not only made of a polymer compound having hydrophilic functional groups but also chemically bonded to the support surface directly, and the image forming layer is provided on such a hydrophilic layer, and further the support surface is roughened, if desired. Therefore, the present hydrophilic layer has both high hydrophilicity and high bonding force to the support to ensure remarkable improvement in scumming resistance. Thus, positive- or negative-working lithographic printing plate precursors capable of providing scum-free prints under severe printing conditions can be prepared using the present supports.

While the invention has been described in detail and with reference to specific embodiments thereof, it will be apparent to one skilled in the art that various changes and modifications can be made therein without departing from the spirit and scope thereof.

This application is based on Japanese patent applications No. Hei-11-277010 filed on Sep. 29, 1999, No. 2000-119587 filed on Apr. 20, 2000, No. 2000-119559 filed on Apr. 20, 2000 and No. 2000-121177 filed on Apr. 21, 2000, the entire contents of which are incorporated herein by reference.

What is claimed is:

1. A lithographic printing plate support, comprising a support and a hydrophilic layer on the support, wherein the hydrophilic layer comprises a polymer compound that is chemically bonded directly to the support surface and has a hydrophilic functional group, said polymer compound being a hydrophilic functional group-containing straight-chain polymer compound that is chemically bonded directly to the support surface at an end of the polymer chain.

2. A lithographic printing plate precursor comprising a support, a hydrophilic layer and an image-forming layer in this order, wherein the hydrophilic layer comprises a polymer compound that is chemically bonded directly to the support surface and has a hydrophilic functional group, said polymer compound being a hydrophilic functional group-containing straight-chain polymer compound that is chemically bonded directly to the support surface at an end of the polymer chain.

3. A lithographic printing plate precursor comprising a support, a hydrophilic layer and a sensitive layer in this order, wherein the hydrophilic layer comprises a polymer compound that is chemically bonded directly to the support surface and has a hydrophilic functional group and the sensitive layer comprises a polymer compound containing a functional group capable of changing the hydrophobic or hydrophilic property upon exposure to heat, acid or radiation.

4. A lithographic printing plate precursor comprising a support, a hydrophilic layer comprising a polymer compound that is chemically bonded directly to the support surface and has a hydrophilic functional group and on the hydrophilic layer an ablative ink-receiving layer, said polymer compound being a hydrophilic functional group-containing straight-chain polymer compound that is chemically bonded directly to the support surface at an end of the polymer chain.

5. A lithographic printing plate support, comprising a support and a hydrophilic layer on the support, wherein the hydrophilic layer comprises a polymer compound that is chemically bonded directly to the support surface and has a hydrophilic functional group, said polymer compound comprising (a) a polymer backbone chemically bonded to the support surface and (b) a hydrophilic functional group-containing straight-chain polymer compound combined at an end of a polymer chain thereof with the polymer backbone.

6. A lithographic printing plate precursor comprising a support, a hydrophilic layer and an image-forming layer in this order, wherein the hydrophilic layer comprises a polymer compound that is chemically bonded directly to the support surface and has a hydrophilic functional group, said polymer compound comprising (a) a polymer backbone chemically bonded to the support surface and (b) a hydrophilic functional group-containing straight-chain polymer compound combined at an end of a polymer chain thereof with the polymer backbone.

* * * * *